(12) United States Patent
Liao et al.

(10) Patent No.: US 9,074,754 B2
(45) Date of Patent: Jul. 7, 2015

(54) LIGHT SOURCE MODULE

(71) Applicants: Chien-Chung Liao, Hsin-Chu (TW); Hung-Wei Liu, Hsin-Chu (TW)

(72) Inventors: Chien-Chung Liao, Hsin-Chu (TW); Hung-Wei Liu, Hsin-Chu (TW)

(73) Assignee: Young Lighting Technology Inc., Hsin-chu (TW)

( * ) Notice: Subject to any disclaimer, the term of this patent is extended or adjusted under 35 U.S.C. 154(b) by 96 days.

(21) Appl. No.: 13/914,583

(22) Filed: Jun. 10, 2013

(65) Prior Publication Data
US 2013/0343061 A1 Dec. 26, 2013

(30) Foreign Application Priority Data
Jun. 26, 2012 (CN) .......................... 2012 1 0212860

(51) Int. Cl.
| | |
|---|---|
| *F21V 13/04* | (2006.01) |
| *F21V 8/00* | (2006.01) |
| *H01L 33/58* | (2010.01) |
| *F21V 13/14* | (2006.01) |
| *H01L 25/075* | (2006.01) |

(52) U.S. Cl.
CPC ................. *F21V 13/04* (2013.01); *F21V 13/14* (2013.01); *G02B 6/0035* (2013.01); *G02B 6/0078* (2013.01); *H01L 33/58* (2013.01); *H01L 25/0753* (2013.01)

(58) Field of Classification Search
CPC ............................. F21V 13/04; G02B 6/0035
USPC ............... 362/311.01, 311.02, 299, 235, 520, 362/97.3, 541, 612, 97.1
See application file for complete search history.

(56) References Cited

U.S. PATENT DOCUMENTS

| | | | |
|---|---|---|---|
| 6,598,998 B2 | 7/2003 | West et al. | |
| 6,773,154 B2 * | 8/2004 | Desai | 362/541 |
| 7,399,108 B2 | 7/2008 | Ayabe et al. | |
| 7,470,042 B2 | 12/2008 | Ayabe et al. | |
| 7,572,036 B2 | 8/2009 | Yoon et al. | |
| 7,762,705 B2 * | 7/2010 | Sakai et al. | 362/619 |
| 7,866,844 B2 | 1/2011 | Yamaguchi | |
| 7,988,337 B2 * | 8/2011 | Huang | 362/299 |

(Continued)

FOREIGN PATENT DOCUMENTS

| | | |
|---|---|---|
| CN | 102062337 | 5/2011 |
| CN | 102287679 | 12/2011 |

(Continued)

OTHER PUBLICATIONS

"Office Action of China Counterpart Application", issued on Mar. 31, 2015, p1-p7, in which the listed references were cited.

*Primary Examiner* — Anabel Ton
(74) *Attorney, Agent, or Firm* — Jianq Chyun IP Office

(57) ABSTRACT

A light source module is provided, which includes at least one light emitting unit and at least one light guide element. The light emitting unit includes a light source and a lens structure. The light source is used for emitting a light beam. The lens structure has a bottom surface, a top surface opposite to the bottom surface, and a first surface connecting the bottom surface and the top surface. The bottom surface has a first recess and a second recess connecting the first recess and the first surface. The top surface has a third recess. The light guide element includes at least one opening and a plurality of first optical micro-structures disposed beside the opening. The light emitting unit is disposed in the opening. The light beam passes through the lens structure and enters the light guide element via the opening.

32 Claims, 12 Drawing Sheets

(56) References Cited

U.S. PATENT DOCUMENTS

| | | | |
|---|---|---|---|
| 8,033,695 B2* | 10/2011 | Kerr et al. | 362/364 |
| 8,240,902 B2* | 8/2012 | Fujimoto et al. | 362/559 |
| 8,267,538 B2* | 9/2012 | Lin | 362/97.3 |
| 2002/0015297 A1 | 2/2002 | Hayashi et al. | |
| 2009/0052192 A1 | 2/2009 | Kokubo et al. | |
| 2010/0079980 A1* | 4/2010 | Sakai | 362/97.1 |
| 2010/0128487 A1* | 5/2010 | Lin | 362/311.02 |
| 2012/0113620 A1 | 5/2012 | Ho et al. | |
| 2014/0063849 A1* | 3/2014 | Chang et al. | 362/612 |

FOREIGN PATENT DOCUMENTS

| | | |
|---|---|---|
| CN | 102287690 | 12/2011 |
| JP | 2000-214460 | 8/2000 |
| JP | 2012109243 | 6/2012 |
| TW | M319426 | 9/2007 |

* cited by examiner

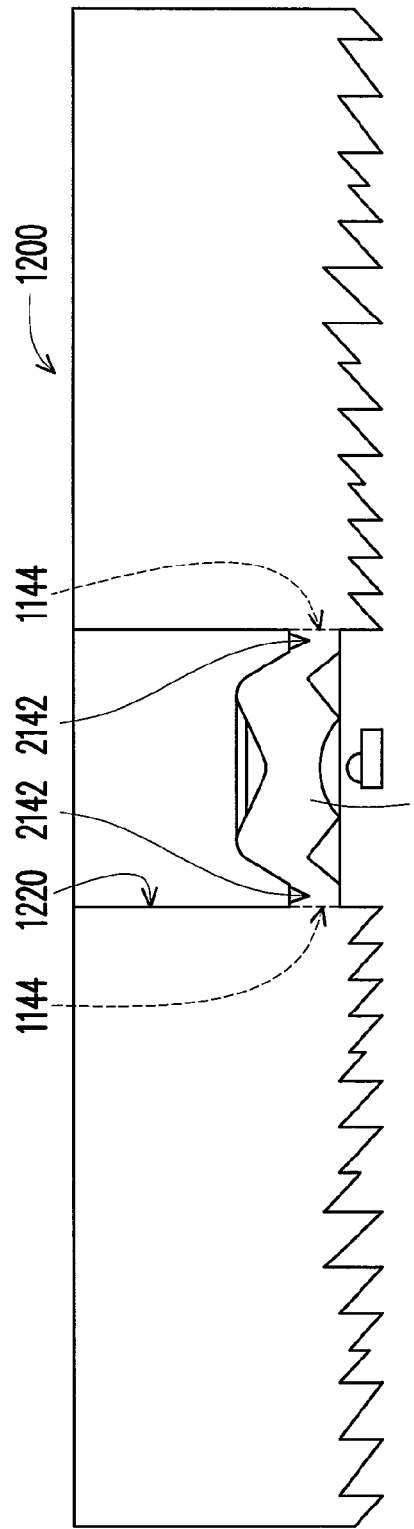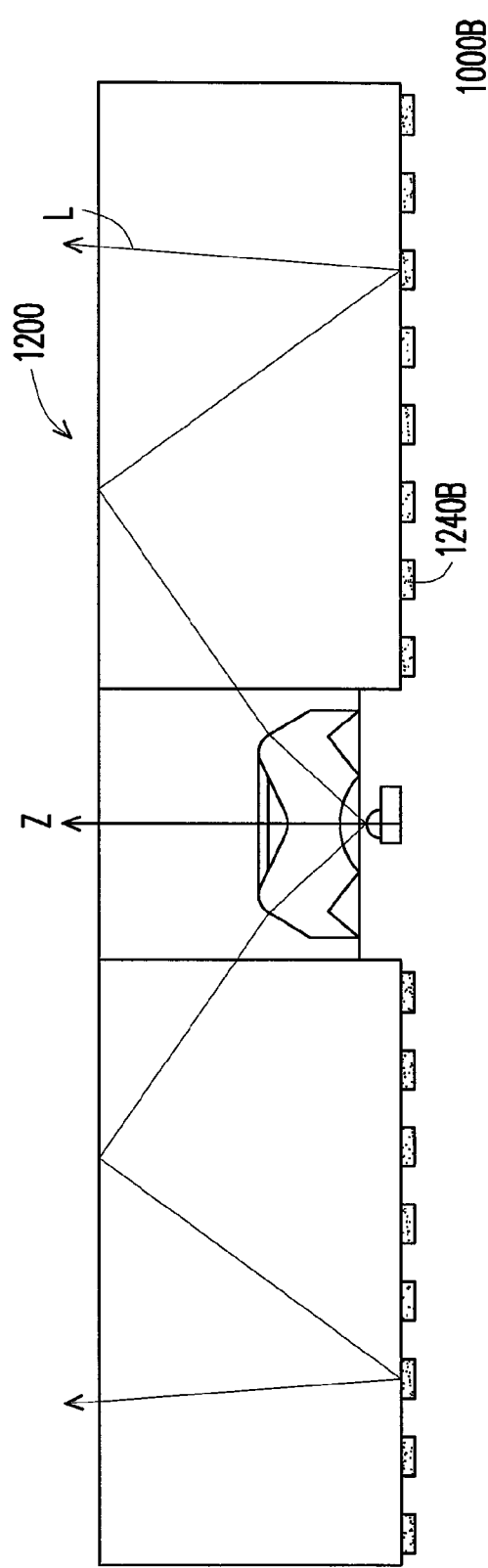

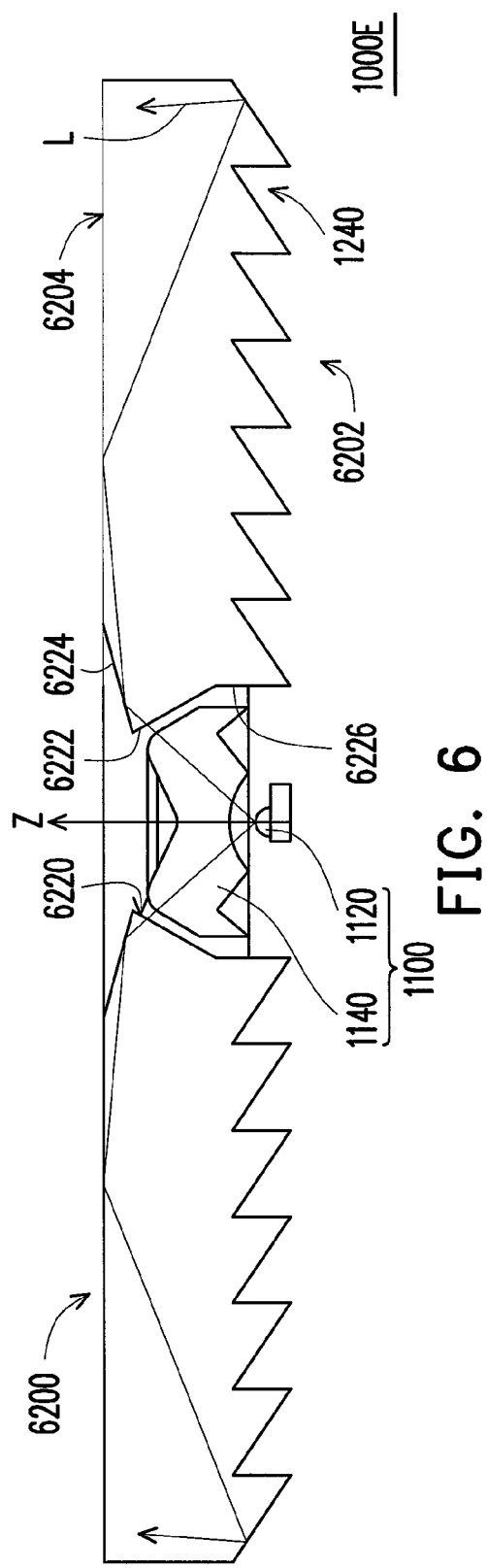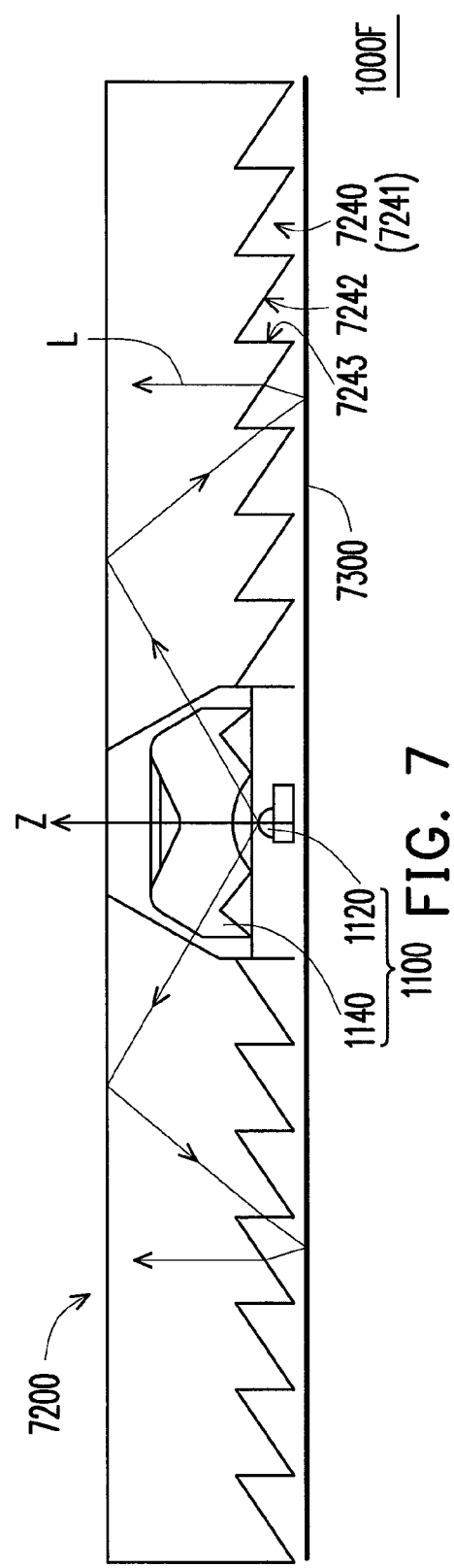

LIGHT SOURCE MODULE

CROSS-REFERENCE TO RELATED APPLICATION

This application claims the priority benefit of China application serial no. 201210212860.2, filed on Jun. 26, 2012. The entirety of the above-mentioned patent application is hereby incorporated by reference herein and made a part of this specification.

BACKGROUND OF THE INVENTION

1. Field of the Invention

The invention relates to an optical device and particularly relates to a light source module.

2. Description of Related Art

Nowadays, a light source module which utilizes multiple point light sources to form a plane light source is extensively applied in various types of display devices. The light source module including a light emitting diode is applicable to many types of products, ranging from small-sized portable electronic products, such as mobile phones, cameras, MP3, to middle-sized or large-sized products, such as digital photo frames, personal monitors, TV screens for vehicles, LCD TVs, etc.

The most important features of the light source module are uniformity and brightness. In order to achieve favorable uniformity, the approach in current technology respectively diffuses the light beams emitted by the point light sources. Generally, the light beam from the point light source is diffused by a lens structure. However, the light beam diffused by the lens structure usually has a large diffusion angle, and human eyes cannot completely receive light with overly large diffusion angles; as a result, the brightness received by human eyes is reduced. Therefore, the approach in current technology tends to dispose a diffusion plate before the lens structure to guide the light beams with overly large diffusion angles, such that human eyes can effectively receive the light beams emitted by the point light sources. However, after being guided by the diffusion plate, many of the light beams will be scattered by the scattering particles in the diffusion plate, and the result of a part of the light beams cannot be transmitted toward a viewing direction of human eyes. Consequently, the light source module has the problem of low efficiency of light utilization.

Related technology is given below for reference. U.S. Pat. No. 7,866,844, U.S. Pat. No. 7,572,036, and US patent application publication No. 20090052192, disclose light sources and lenses. U.S. Pat. No. 6,598,998 discloses a light source device having an LED chip and a lens configured in a light guide. US patent application publication No. 20020015297 discloses a light emitting unit having a cathode tube and an optical wave guide. Taiwan patent No. M319426 discloses a backlight module having a light source, a light guide plate, and a reflective sheet. Japanese patent No. 2000-214460 discloses a backlight module having a light guide body and a reflective sheet. U.S. Pat. No. 7,470,042 and U.S. Pat. No. 7,399,108 disclose illumination light sources having light emitting elements and reflective elements.

SUMMARY OF THE INVENTION

The invention provides a light source module with high efficiency of light utilization.

Other objects and advantages of the invention may be further illustrated by the technical features broadly embodied and described as follows.

In order to achieve one of or part or all of the above purposes or other purposes, an embodiment of the invention provides a light source module. The light source module includes at least one light emitting unit and at least one light guide element. The light emitting unit includes a light source and a lens structure. The light source emits a light beam and has an optical axis. The lens structure has a bottom surface, a top surface opposite to the bottom surface, and a first surface connecting the bottom surface and the top surface. The bottom surface faces toward the light source and has a first recess and a second recess connecting the first recess and the first surface. The top surface has a third recess. The optical axis of the light source passes through the first recess and the third recess, and the first surface inclines relative to the optical axis. The light guide element includes at least one opening and a plurality of first optical micro-structures disposed beside the opening. The light emitting unit is disposed in the opening. The light beam passes through the lens structure and enters the light guide element via the opening.

In an embodiment of the invention, the light beam enters the lens structure via the first recess.

In an embodiment of the invention, a portion of the light beam is refracted to the third recess by the first recess, and the portion of the light beam that is transmitted to the third recess is reflected to the first surface by the third recess and leaves the lens structure via the first surface.

In an embodiment of the invention, the portion of the light beam forms a first angle with the optical axis before entering the lens structure, and the first angle is in a range of 0-25 degrees.

In an embodiment of the invention, the portion of the light beam is refracted to the third recess by the first recess, the portion of the light beam transmitted to the third recess is reflected to the first surface by the third recess, the portion of the light beam transmitted to the first surface is reflected to the second recess by the first surface, and the portion of the light beam transmitted to the second recess is reflected by the second recess and exits the lens structure.

In an embodiment of the invention, the portion of the light beam forms a second angle with the optical axis before entering the lens structure, and the second angle is in a range of 25-40 degrees.

In an embodiment of the invention, the lens structure further has a second surface connecting the second recess of the bottom surface and the first surface, wherein the portion of the light beam is transmitted to the second surface after being reflected by the second recess and exits the lens structure via the second surface.

In an embodiment of the invention, the optical axis is located on a reference plane. Sectional lines of the second surface on the reference plane include two line segments. The two line segments are substantially parallel to the optical axis.

In an embodiment of the invention, the second recess includes a side wall that inclines relative to the optical axis.

In an embodiment of the invention, the portion of the light beam is refracted to the third recess by the first recess, the portion of the light beam transmitted to the third recess is reflected to the first surface by the third recess, the portion of the light beam transmitted to the first surface is reflected to the side wall of the second recess by the first surface, and the portion of the light beam transmitted to the side wall of the second recess is reflected by the side wall of the second recess and exits the lens structure.

In an embodiment of the invention, the side wall is a curved surface.

In an embodiment of the invention, the portion of the light beam is refracted to the first surface by the first recess and directly exits the lens structure via the first surface.

In an embodiment of the invention, the portion of the light beam forms a third angle with the optical axis before entering the lens structure, and the third angle is in a range of 40-60 degrees.

In an embodiment of the invention, the lens structure further has a third surface connecting the third recess and the first surface. The third surface is a curved surface that protrudes in a direction away from the light source.

In an embodiment of the invention, the optical axis is located on a reference plane, a sectional line of the third recess on the reference plane includes a first sectional line, a sectional line of the third surface on the reference plane includes a second sectional line, and an included angle formed by the optical axis and a connection line between an intersection point of the first sectional line and the second sectional line and the light source is greater than 25 degrees.

In an embodiment of the invention, the optical axis is located on a reference plane, a sectional line of the third surface on the reference plane includes a second sectional line, a sectional line of the first surface on the reference plane includes a third sectional line, and an included angle formed by the optical axis and a connection line between an intersection point of the second sectional line and the third sectional line and the light source is greater than 40 degrees.

In an embodiment of the invention, the lens structure further has a second surface connecting the first surface and the second recess, the optical axis is located on a reference plane, a sectional line of the first surface on the reference plane includes a third sectional line, a sectional line of the second surface on the reference plane includes a fourth sectional line, and an included angle formed by the optical axis and a connection line between an intersection point of the third sectional line and the fourth sectional line and the light source is greater than 60 degrees.

In an embodiment of the invention, the optical axis passes through a center of the first recess and a center of the third recess.

In an embodiment of the invention, the first recess, the second recess, the third recess, or the first surface is circularly symmetrical to the optical axis.

In an embodiment of the invention, the first recess is a curved surface.

In an embodiment of the invention, the first recess is a curved surface that is recessed in a direction away from the light source.

In an embodiment of the invention, the second recess surrounds the first recess.

In an embodiment of the invention, the optical axis is located on a reference plane, and sectional lines of the third recess of the lens structure on the reference plane include two curved lines that intersect each other, and the curved lines protrude outward from the lens structure.

In an embodiment of the invention, the third recess is a tapered recess.

In an embodiment of the invention, the first surface surrounds the optical axis.

In an embodiment of the invention, the first surface is a curved surface.

In an embodiment of the invention, the lens structure and the light guide element are integrally formed.

In an embodiment of the invention, each of the first optical micro-structures has a circular groove, which has an inclined plane and a vertical plane, wherein the inclined plane is configured at the periphery of the vertical plane.

In an embodiment of the invention, each of the first optical micro-structures has a circular groove, which has an inclined plane and a vertical plane, wherein the vertical plane of each circular groove is configured at the periphery of the inclined plane and inclines towards the optical axis.

In an embodiment of the invention, a depth of the circular groove of each of the first optical micro-structures gradually increases in a direction away from the optical axis and then gradually decreases.

In an embodiment of the invention, a slope of the inclined plane of the circular groove of each of the first optical micro-structures gradually increases in the direction away from the optical axis and then gradually decreases.

In an embodiment of the invention, the first optical micro-structures are a plurality of the circular grooves that surround the optical axis.

In an embodiment of the invention, the first optical micro-structures are a plurality of the scattering structures.

In an embodiment of the invention, the light source module further includes a reflective sheet, and the light guide element includes a bottom surface and a top surface opposite to the bottom surface, wherein the first optical micro-structures and the opening are configured on the bottom surface of the light guide element, and the reflective sheet is disposed besides the bottom surface.

In an embodiment of the invention, the light guide element includes a bottom surface and a top surface opposite to the bottom surface, the first optical micro-structures and the opening are configured on the bottom surface of the light guide element, the opening includes a first side wall connecting the bottom surface and the top surface of the light guide element, and the first side wall of the opening surrounds the optical axis and includes a tower-shaped top having a gradually decreasing caliber.

In an embodiment of the invention, the opening further has a second side wall connecting the top surface of the light guide element and the first side wall of the opening, and the second side wall of the opening surrounds the optical axis and has a tower shape with a gradually increasing caliber.

In an embodiment of the invention, a plurality of the light guide elements are configured adjacent to each other on the same plane.

In an embodiment of the invention, each of the light guide elements includes a bottom surface, a top surface opposite to the bottom surface, and a lateral surface connecting the bottom surface and the top surface, wherein the first optical micro-structures and the opening of each of the light guide elements are configured on the bottom surface of the light guide element, and the bottom surface includes a recess platform connecting the first optical micro-structures and the lateral surface of the light guide element.

In an embodiment of the invention, each of the light guide elements further has a plurality of second optical micro-structures configured on the recess platform.

In an embodiment of the invention, each of the light guide elements has a bottom surface, a top surface opposite to the bottom surface, and a lateral surface connecting the bottom surface and the top surface, wherein each of the light guide elements includes a plurality of third optical micro-structures configured on an edge area of the top surface.

Based on the above, by coordinating the lens structure and the light guide element, the light beam from the light source of the light source module disclosed in the embodiments of the invention is uniformly emitted from the light emitting side of the light guide element and focused on the viewing direction (i.e. extension direction of the optical axis). Accordingly, the light source modules of the embodiments of the invention may guide the light beam without overly using the conventional diffusion plate, and achieve high efficiency of light utilization and uniformity.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

FIG. 2 is a schematic diagram of a light source module according to the second embodiment of the invention.

FIG. 3 is a schematic diagram of a light source module according to the third embodiment of the invention.

FIG. 6 is a schematic diagram of a light source module according to the sixth embodiment of the invention.

FIG. 7 is a schematic diagram of a light source module according to the seventh embodiment of the invention.

DESCRIPTION OF EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

First Embodiment

Figure 1A:
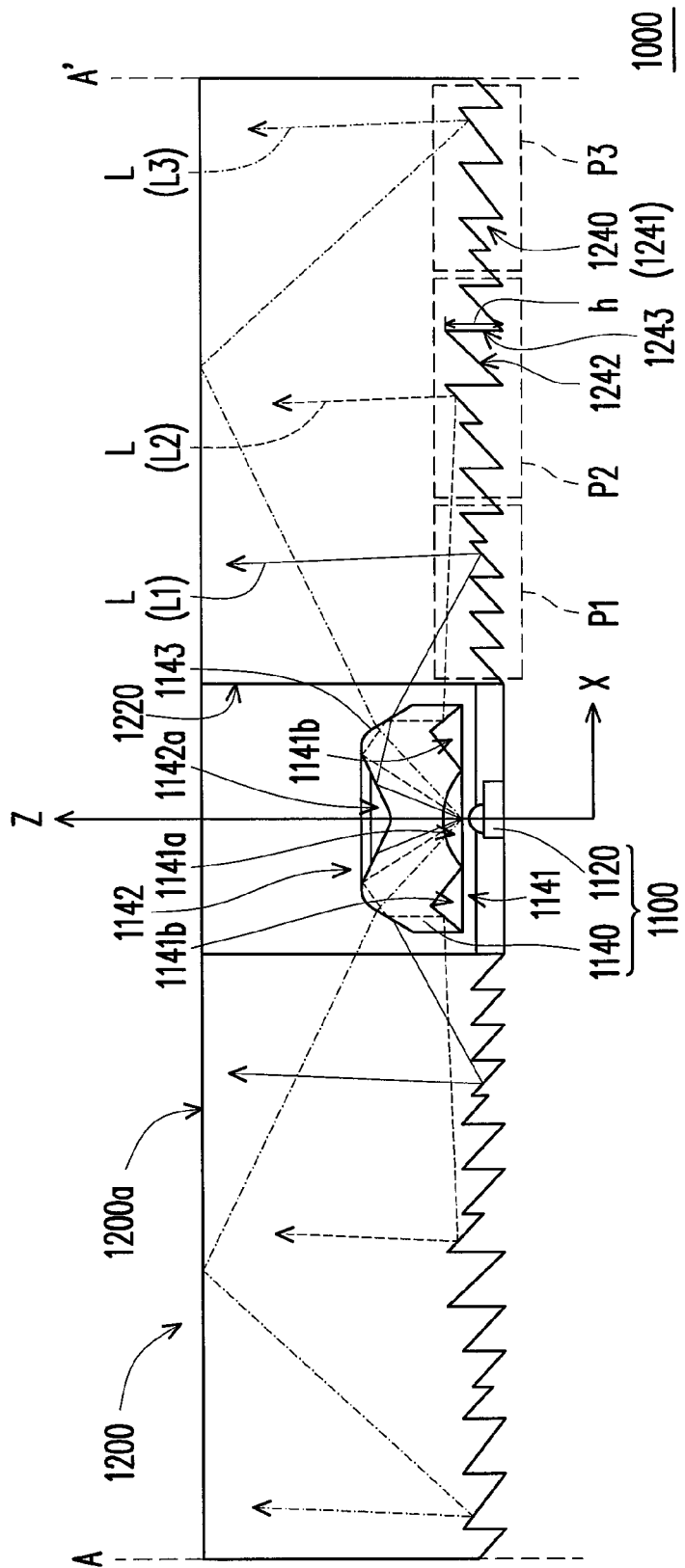
FIG. 1A is a schematic diagram of a light source module according to the first embodiment of the invention.

FIG. 1A is a schematic diagram of a light source module according to the first embodiment of the invention. Referring to FIG. 1A, a light source module 1000 includes at least one light emitting unit 1100 and at least one light guide element 1200. The light emitting unit 1100 includes a light source 1120 and a lens structure 1140. The light source 1120 is used for emitting a light beam L and has an optical axis Z. The lens structure 1140 includes a bottom surface 1141, a top surface 1142 opposite to the bottom surface 1141, and a first surface 1143 connecting the bottom surface 1141 and the top surface 1142. The bottom surface 1141 faces towards the light source 1120 and includes a first recess 1141a and a second recess 1141b that connects the first recess 1141a and the first surface 1143. The top surface 1142 includes a third recess 1142a. The optical axis Z of the light source 1120 passes through the first recess 1141a and the third recess 1142a. The first surface 1143 inclines relative to the optical axis Z. The light guide element 1200 includes at least one opening 1220 and a plurality of first optical micro-structures 1240 disposed beside the opening 1220. The light emitting unit 1100 is disposed in the opening 1220. The light beam L passes through the lens structure 1140 and enters the light guide element 1200 from the opening 1220.

In this embodiment, the light source 1120 of the light emitting unit 1100 is a light emitting diode or other suitable light emitting elements. In addition, the light source 1120 is not necessarily disposed completely in the opening 1220. In other embodiments, the light source 1120 is disposed outside the opening 1220, and the light beam L emitted by the light source 1120 is transmitted to the lens structure 1140 in the opening 1220 by an environmental medium or other light guide devices.

Figure 1B:
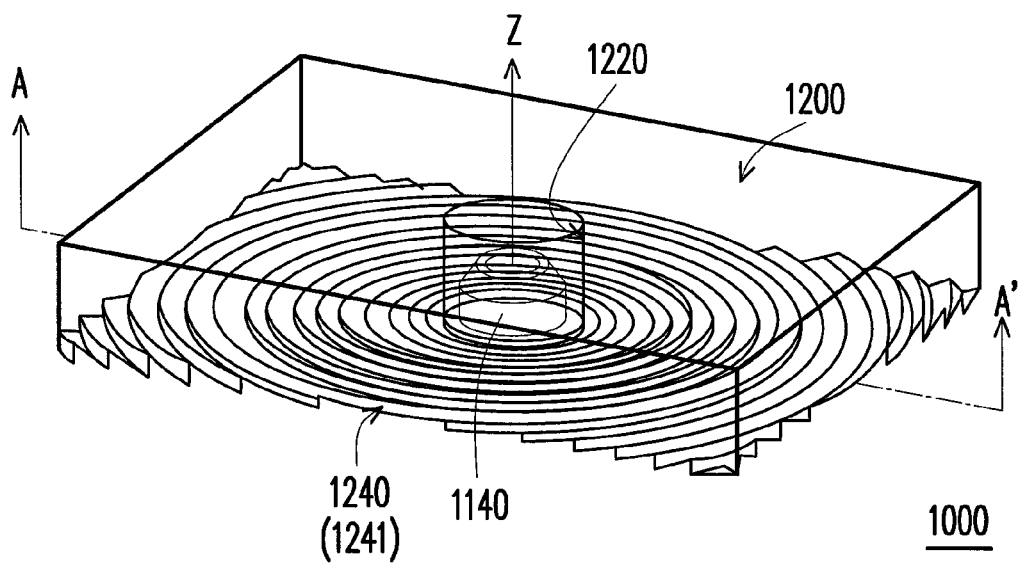
FIG. 1B is a perspective diagram of the light source module of FIG. 1A.

To clearly illustrate the light source module 1000 of this embodiment, FIG. 1A defines a reference plane. The reference plane is a plane (i.e. paper plane) where the optical axis Z and an axis X are located, wherein the optical axis Z and the axis X are substantially perpendicular to each other. With reference to FIG. 1A, in this embodiment, the light guide element 1200 of the light source module 1000 is a light guide plate. Moreover, the first optical micro-structures 1240 of the light guide element 1200 are indented structures each having an indented shape. Referring to FIG. 1B at the same time, In more detail, each of the first optical micro-structures 1240 further includes a circular groove 1241, which has an inclined plane 1242 and a vertical plane 1243. The vertical plane 1243 of the circular groove 1241 is located at a periphery of the inclined plane 1242. It should be noted that a depth h of the circular groove 1241 of the first optical micro-structure 1240 gradually increases in a direction away from the optical axis Z and then gradually decreases. In more detail, in this embodiment, the light guide element 1200 is approximately divided into an inner area P1, a middle area P2, and an outer area P3 along the direction away from the optical axis Z. A ratio of the depths h of the circular grooves 1241 in the inner area P1, the middle area P2, and the outer area P3 is, for example, 2:x:3, wherein x is in a range of 3-4.

Moreover, in this embodiment, a slope of the inclined plane 1242 of the circular groove 1241 first gradually increases in the direction away from the optical axis Z and then gradually decreases. That is, given that an included angle between the inclined plane 1242 and the axis X is $\theta$ (not shown); tan $\theta$ is the slope of the inclined plane 1242. As the slope (i.e. tan $\theta$) of the inclined plane 1242 gradually increases and then decreases in the direction away from the optical axis Z, the included angle $\theta$ (not shown) between the inclined plane 1242 and the axis X also gradually increases and then decreases in the direction away from the optical axis Z. In more detail, in this embodiment, the included angle between the inclined plane 1242 of the circular groove 1241 in the inner area P1 and the axis X is 33 degrees; the included angle between the inclined plane 1242 of the circular groove 1241 in the middle area P2 and the axis X is 38-40 degrees; and the included angle between the inclined plane 1242 of the circular groove 1241 in the outer area P3 and the axis X is 30-32 degrees.

FIG. 1B is a perspective diagram of the light source module of FIG. 1A. Particularly, FIG. 1A corresponds to the sectional line A-A' of FIG. 1B. Referring to FIG. 1B, in this embodiment, the first optical micro-structures 1240 are circularly symmetrical relative to the optical axis Z. As shown in FIG. 1B, the first optical micro-structures 1240 are a plurality of the circular grooves 1241 that are configured to surround the optical axis Z. As shown in FIG. 1A, a proceeding direction of the light beam L from the light emitting unit 1100 is changed by the first optical micro-structures 1240. In more detail, the proceeding direction of the light beam L is changed from the direction away from the optical axis Z to a direction parallel to the optical axis Z via the first optical micro-structures 1240. In other words, with coordination of the light emitting unit 1100 and the first optical micro-structures 1240, the light beam L of the light source 1120 is uniformly emitted from a light emitting side 1200*a* of the light guide element 1200 and focused on a viewing direction (i.e. the direction parallel to the optical axis Z). Accordingly, the light source module 1000 of this embodiment may guide the light beam without overly using the conventional diffusion plate, and achieve high efficiency of light utilization and uniformity.

Figure 1C:
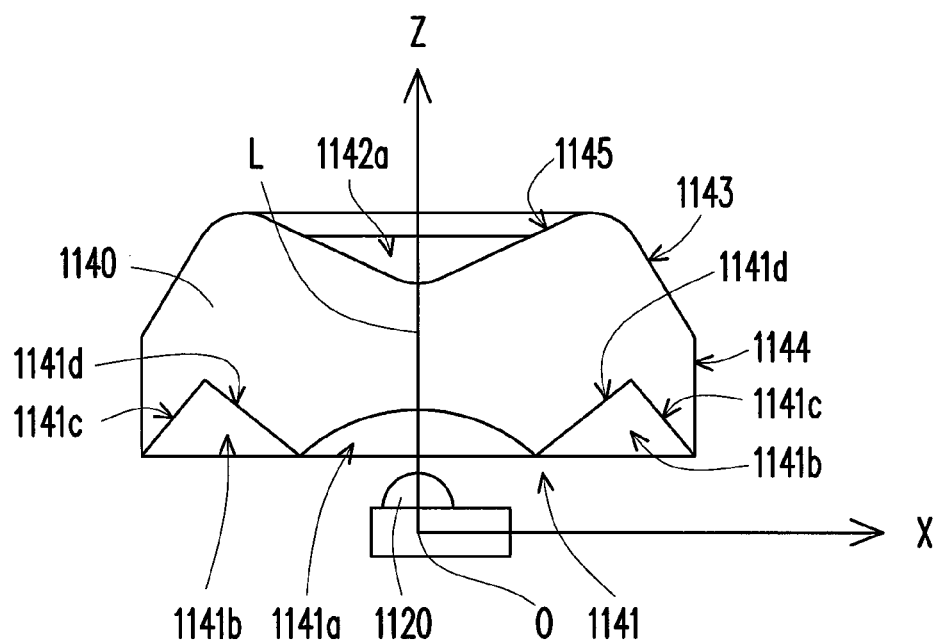
FIG. 1C is a schematic enlarged diagram of a light emitting unit of FIG. 1A.

FIG. 1C is an enlarged schematic view of the light emitting unit 1100 of FIG. 1A. Referring to FIG. 1C, the light source 1120 has the optical axis Z. A light distribution emitted by the light source 1120 is symmetrical to the optical axis Z. In this embodiment, the optical axis Z passes through a center of the first recess 1141*a* and a center of the third recess 1142*a* of the lens structure 1140. Similarly, in order to clearly illustrate the lens structure 1140, FIG. 1C defines a reference plane. The reference plane is a plane (i.e. paper plane) where the optical axis Z and the axis X are located, wherein the optical axis Z and the axis X are substantially perpendicular to each other. A cross-sectional view of the light emitting unit 1100 of this embodiment is depicted on the reference plane, wherein the light source 1120 is located on an origin 0 where the optical axis Z and the axis X intersect.

The lens structure 1140 of this embodiment is described in further detail with reference to FIG. 1C below. The lens structure 1140 of this embodiment further includes a second surface 1144 that connects the second recess 1141*b* and the first surface 1143. In this embodiment, the second surface 1144 surrounds the optical axis Z without intersecting the optical axis Z. In more detail, sectional lines of the second surface 1144 on the reference plane (i.e. the paper plane) include two straight lines. The two straight lines are substantially parallel to the optical axis Z. Moreover, the lens structure 1140 of this embodiment further includes a third surface 1145 that connects the third recess 1142*a* and the first surface 1143. In this embodiment, the third surface 1145 is a curved surface that protrudes in a direction away from the light source 1120. The second recess 1141*b* has a side wall 1141*c* that inclines relative to the optical axis Z. The side wall 1141*c* may be a curved surface. In addition, the second recess 1141*b* further includes a fourth surface 1141*d* that connects the side wall 1141*c* of the second recess 1141*b* and the first recess 1141*a*.

With reference to FIG. 1C, the first recess 1141*a* of the lens structure 1140 may be a curved surface. In more detail, the first recess 1141*a* is a curved surface that is recessed in the direction away from the light source 1120. The third recess 1142*a* of the lens structure 1140 may also be a curved surface. In more detail, sectional lines of the third recess 1142*a* of the lens structure 1140 on the reference plane (i.e. the paper plane) include two curved lines that intersect each other, and the curved lines respectively protrude upward from the lens structure 1140 (not shown).

With reference to FIG. 1B and FIG. 1C, from the appearance of the lens structure 1140 of this embodiment, the first recess 1141*a*, the second recess 1141*b*, the third recess 1142*a*, the first surface 1143, the second surface 1144, and the third surface 1145 are circularly symmetrical relative to the optical axis Z. The first recess 1141*a*, the second recess 1141*b*, and the third recess 1142*a* are respectively recessed towards the inside of the lens structure 1140. The third recess 1142*a* may be a tapered recess. Moreover, the first surface 1143, the second surface 1144, and the third surface 1145 surround the optical axis Z, and the second recess 1141*b* surrounds the first recess 1141*a*.

In order to make the optical features of the lens structure 1140 of this embodiment more comprehensible to persons skilled in the art, a transmission of the light beam L in the lens structure 1140 is explained below.

Figure 1D:
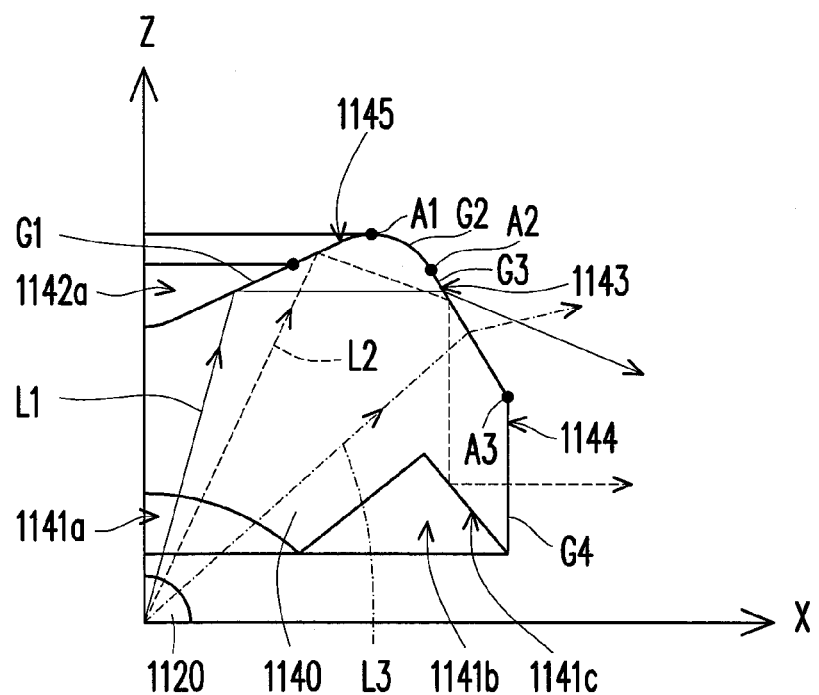
FIG. 1D illustrates a transmission path of a light beam in a lens structure of FIG. 1A.

FIG. 1D illustrates a transmission path of the light beam in the lens structure of FIG. 1A. Similar to FIG. 1C, FIG. 1D defines a reference plane, which is a plane (i.e. paper plane) where the optical axis Z and the axis X are located. Since the lens structure 1140 of this embodiment is circularly symmetrical to the optical axis Z, the transmission path of the light beam in the lens structure 1140 is also circularly symmetrical to the optical axis Z. FIG. 1D merely illustrates the transmission path of the light beam L at one side of the optical axis Z as an example.

With reference to FIG. 1D, an included angle between the optical axis Z and the light beam L before entering the lens structure 1140 is relevant to the transmission path of the light beam L in the lens structure 1140. In more detail, after a light beam L1, which forms a first included angle (about 0-25 degrees) with the optical axis Z, enters the lens structure 1140, the light beam L1 goes through one refraction, one internal total reflection, and another refraction and then exits the lens structure 1140. In more detail, because the first recess 1141*a* is a curved surface, when the light beam L1 enters the lens structure 1140, the first recess 1141*a* refracts the light beam L1 towards the third recess 1142a. Then, the light beam L1 is totally reflected to the first surface 1143 by the third recess 1142a. Thereafter, the light beam L1 is refracted by the first surface 1143 and exits the lens structure 1140. Referring to FIG. 1A and FIG. 1D at the same time, after the light beam L1 exits the lens structure 1140, the light beam L1 is transmitted to the inclined plane 1242 of the circular groove 1241 of the first optical micro-structure 1240 in the inner area P1. The inclined plane 1242 then reflects the light beam L1 away from the light guide element 1200 in a direction more parallel to the optical axis Z.

With reference to FIG. 1D, in this embodiment, after a light beam L2, which forms a second included angle (about 25-40 degrees) with the optical axis Z, enters the lens structure 1140, the light beam L2 goes through one refraction, three internal total reflections, and another refraction and then exits the lens structure 1140. In more detail, when the light beam L2 enters the lens structure 1140, the first recess 1141a refracts the light beam L2 towards the third recess 1142a. Then, the light beam L2 is totally reflected to the first surface 1143 by the third recess 1142a. Following that, the light beam L2 is totally reflected by the first surface 1143 and transmitted to the side wall 1141c of the second recess 1141b. The side wall 1141c of the second recess 1141b further reflects the light beam L2 to the second surface 1144. Finally, the light beam L2 is refracted by the second surface 1144 and exits the lens structure 1140. Referring to FIG. 1A and FIG. 1D at the same time, after the light beam L2 exits the lens structure 1140, the light beam L2 is transmitted to the inclined plane 1242 of the circular groove 1241 of the first optical micro-structure 1240 in the middle area P2. The inclined plane 1242 then reflects the light beam L2 away from the light guide element 1200 in a direction more parallel to the optical axis Z.

With reference to FIG. 1D, in this embodiment, after a light beam L3, which forms a third included angle (about 40-60 degrees) with the optical axis Z, enters the lens structure 1140, the light beam L3 goes through multiple refractions and then exits the lens structure 1140. In more detail, when the light beam L3 enters the lens structure 1140, the first recess 1141a refracts the light beam L3 towards the first surface 1143. The light beam L3 is refracted at the first surface 1143 and then exits the lens structure 1140. Referring to FIG. 1A and FIG. 1D at the same time, after the light beam L3 exits the lens structure 1140, the light beam L3 is transmitted to the inclined plane 1242 of the circular groove 1241 of the first optical micro-structure 1240 in the outer area P3. The inclined plane 1242 then reflects the light beam L3 away from the light guide element 1200 in a direction more parallel to the optical axis Z.

In the lens structure 1140 of this embodiment, the lens structure 1140 is divided into multiple areas to more clearly illustrate the outer shape of the lens structure 1140. Further referring to FIG. 1D, in the lens structure 1140, a sectional line of the third recess 1142a on the reference plane (i.e. the paper plane) includes a first sectional line G1. A sectional line of the third surface 1145 on the reference plane includes a second sectional line G2. The first sectional line G1 and the second sectional line G2 intersect at an intersection point A1. An acute angle formed by a connection line between the intersection point A1 and the light source 1120 and the optical axis Z may be greater than 25 degrees. In addition, a sectional line of the first surface 1143 on the reference plane includes a third sectional line G3. The second sectional line G2 and the third sectional line G3 intersect at an intersection point A2. An acute angle formed by a connection line between the intersection point A2 and the light source 1120 and the optical axis Z may be greater than 40 degrees. Moreover, a sectional line of the second surface 1144 on the reference plane includes a fourth sectional line G4. The third sectional line G3 and the fourth sectional line G4 intersect at an intersection point A3. An acute angle formed by a connection line between the intersection point A3 and the light source 1120 and the optical axis Z may be greater than 60 degrees.

Figure 1E:
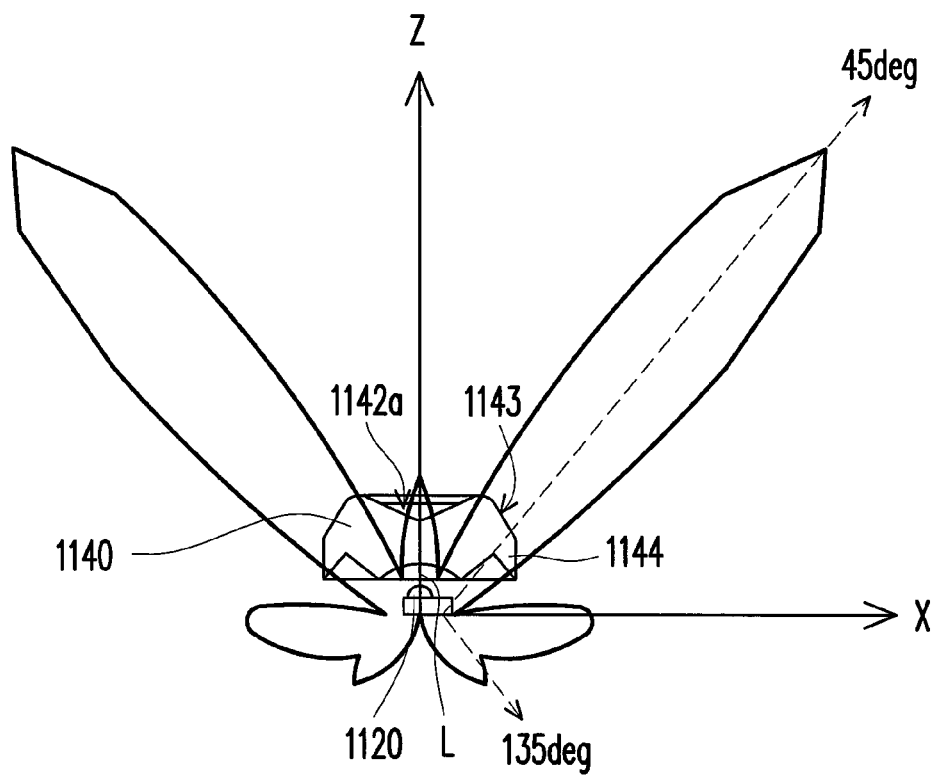
FIG. 1E illustrates a light distribution of the light emitting unit of FIG. 1A.

FIG. 1E illustrates a light distribution of the light emitting unit 1100 of FIG. 1A. It is known from FIG. 1E that the light beam L emitted from the light source 1120 is approximately concentrated in an area near an angle of 45 degrees with respect to the optical axis after exiting the lens structure 1140. In other words, the light beam L, which is emitted from the light source 1120 and enters the lens structure 1140, mostly exits the lens structure 1140 via the first surface 1143 or the second surface 1144. A small portion of the light beam L is concentrated in an area near an angle of 0 degree with respect to the optical axis. In other words, the small portion of the light beam L exits the lens structure 1140 via the third recess 1142a after entering the lens structure 1140. It should be noted that, in this embodiment, a small portion of the light beam L is concentrated in areas near angles of 90 and 135 degrees with respect to the optical axis.

Second Embodiment

FIG. 2 is a schematic diagram of a light source module according to the second embodiment of the invention. A light source module 1000A of this embodiment is similar to the light source module 1000 of the first embodiment. Therefore, identical elements are denoted by the same reference numerals. A main difference between the two light source modules lies in that: in this embodiment, a lens structure 1140A of the light source module 1000A and the light guide element 1200 are integrally formed. The following paragraphs further explain the difference, and the common parts of the two light source modules are omitted hereinafter.

Referring to FIG. 2, the lens structure 1140A of this embodiment and the light guide element 1200 are integrally formed. That is to say, the lens structure 1140A of this embodiment further includes an opening 1220 connecting the light guide element 1200 and a connection part 2142 of the second surface 1144. In this embodiment, the light guide element 1200 and the lens structure 1140A are formed of the same material. Moreover, the light source module 1000A of this embodiment achieves efficiency and advantages similar to those of the light source module 1000 of the first embodiment, which will not be repeated hereinafter. Integrally forming the lens structure 1140A and the light guide element 1200 facilitates the fabrication and positioning.

Third Embodiment

FIG. 3 is a schematic diagram of a light source module according to the third embodiment of the invention. A light source module 1000B of this embodiment is similar to the light source module 1000 of the first embodiment. Therefore, identical elements are denoted by the same reference numerals. A main difference between the two light source modules lies in that: the first optical micro-structures 1240B of this embodiment are different from the first optical micro-structures 1240 of the first embodiment. The following paragraphs further explain the difference, and the common parts of the two light source modules are omitted hereinafter.

The first optical micro-structures 1240B of this embodiment are a plurality of scattering structures. The scattering structures are printing dots, for example. Moreover, the light source module 1000B of this embodiment achieves efficiency and advantages similar to those of the light source module 1000 of the first embodiment, which will not be repeated hereinafter. The printing dots have the advantage that the printing dots may be fabricated easily.

Fourth Embodiment

Figure 4:
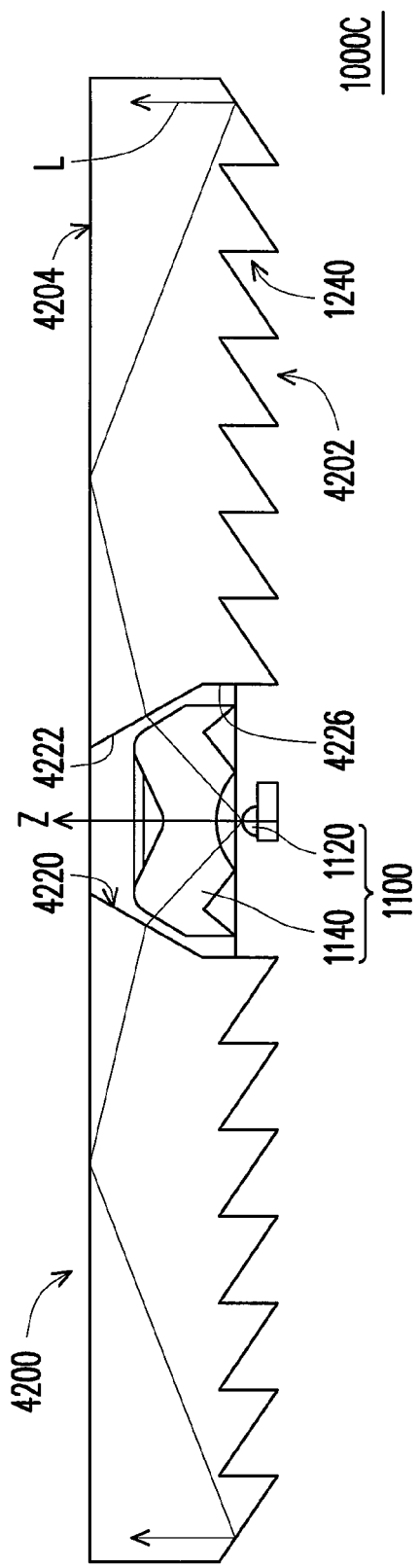
FIG. 4 is a schematic diagram of a light source module according to the fourth embodiment of the invention.

FIG. 4 is a schematic diagram of a light source module according to the fourth embodiment of the invention. A light source module 1000C of this embodiment is similar to the light source module 1000 of the first embodiment. Therefore, identical elements are denoted by the same reference numerals. A main difference between the two light source modules lies in that: a shape of an opening 4220 of this embodiment is different from the shape of the opening 1220 of the first embodiment. The following paragraphs further explain the difference, and the common parts of the two light source modules are omitted hereinafter.

In this embodiment, a light guide element 4200 of the light source module 1000C includes a bottom surface 4202 and a top surface 4204 opposite to the bottom surface 4202. A plurality of first optical micro-structures 1240 and the opening 4220 are configured on the bottom surface 4202 of the light guide element 4200. In this embodiment, the opening 4220 includes a first side wall 4226 connecting the bottom surface 4202 and a tower-shaped top 4222 connecting the top surface 4204 and the first side wall 4226. The first side wall 4226 surrounds the optical axis Z, and an extension direction of the first side wall 4226 is parallel to the optical axis Z. The tower-shaped top 4222 surrounds the optical axis Z and has a caliber that gradually decreases. In other words, the tower-shaped top 4222 and the first side wall 4226 are circularly symmetrical to the optical axis Z. In terms of the overall appearance, the opening 4220 has a tapered top opening, and the light emitting unit 1100 is disposed in the opening 4220.

It should be noted that, because the tower-shaped top 4222 inclines relative to the optical axis Z, the light beam L that proceeds in a direction having a smaller included angle with the optical axis may enter the light guide element 4200 via the tower-shaped top 4222. In more detail, after the light beam L emitted from the light source 1120 exits the lens structure 1140, a portion of the light beam L is refracted at the tower-shaped top 4222 and enters the light guide element 4200. The portion of the light beam L that enters the light guide element 4200 is transmitted to the top surface 4204 and totally reflected by the top surface 4204. The portion of the light beam L that is totally reflected by the top surface 4204 is guided to the top surface 4204 by the first optical micro-structures 1240 on the bottom surface 4202 and exits. Accordingly, by means of the tower-shaped top 4222 that inclines relative to the optical axis Z, the light beam L that proceeds in the direction having a smaller included angle with the optical axis does not directly exit the light guide element 4200 from the opening 4220 easily, and may enter the light guide element 4200 from the tower-shaped top 4222 to improve the efficiency of light utilization of the light source module 1000C. On the other hand, the design of the tower-shaped top 4222 allows the light beam L to enter the light guide element 4200 more easily, and thus the thickness of the light guide element 4200 may be made thinner to fabricate the light source module 1000C of this embodiment with thinner thickness. Moreover, the light source module 1000C of this embodiment achieves efficiency and advantages similar to those of the light source module 1000 of the first embodiment, which will not be repeated hereinafter.

Fifth Embodiment

Figure 5:
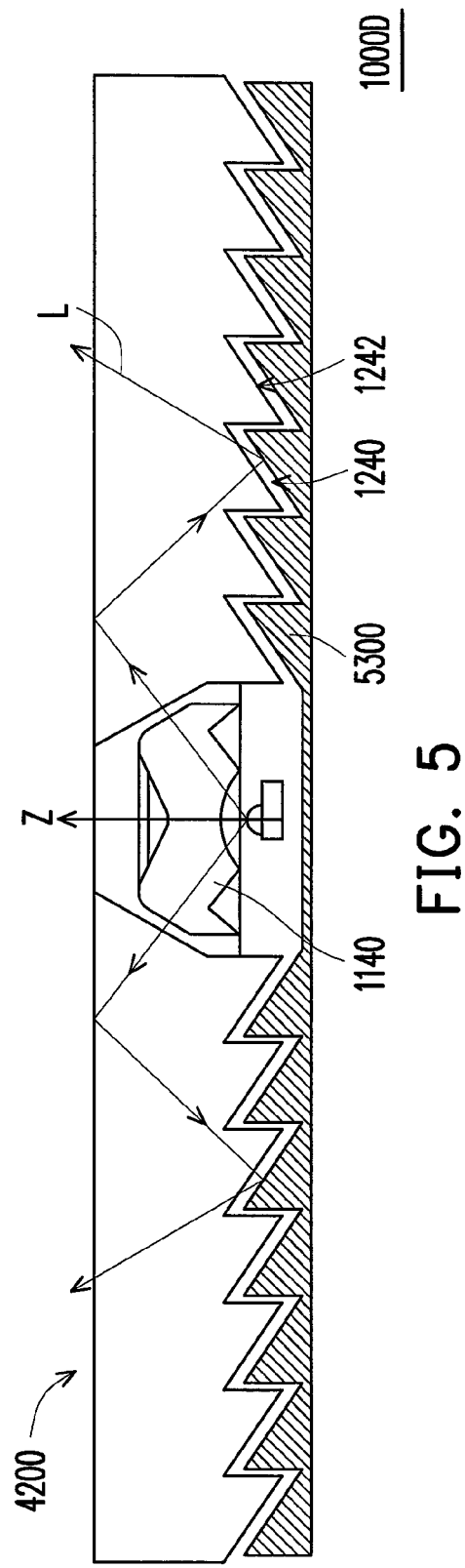
FIG. 5 is a schematic diagram of a light source module according to the fifth embodiment of the invention.

FIG. 5 is a schematic diagram of a light source module according to the fifth embodiment of the invention. A light source module 1000D of this embodiment is similar to the light source module 1000C of the fourth embodiment. Therefore, identical elements are denoted by the same reference numerals. A main difference between the two light source modules lies in that: the light source module 1000D of this embodiment further includes a reflective sheet 5300. The following paragraphs further explain the difference, and the common parts of the two light source modules are omitted hereinafter.

In this embodiment, the reflective sheet 5300 is configured on a side of the first optical micro-structures 1240 and adjacent to the inclined plane 1242 of the first optical micro-structures 1240. In this embodiment, the reflective sheet 5300 is configured on a side of the first optical micro-structures 1240 and adjacent to the inclined planes 1242 of the first optical micro-structures 1240. However, the invention is not limited thereto. In other embodiments, the reflective sheet 5300 has a planar shape (not shown).

After the light beam L enters the light guide element 4200 from the lens structure 1140, a portion of the light beam L is refracted out of the light guide element 4200 by the first optical micro-structures 1240. The light beam L refracted out of the light guide element 4200 is reflected to the inclined plane 1242 of the first optical micro-structures 1240 by the reflective sheet 5300. The light beam L transmitted to the inclined plane 1242 is refracted by the inclined plane 1242 of the first optical micro-structures 1240 and enters the light guide element 4200. Accordingly, the light beam that may exit the light guide element 4200 via the first optical micro-structures is reflected back to the light guide element 4200 by the reflective sheet 5300. Therefore, the light utilization efficiency of the light source module 1000D is improved. Moreover, the light source module 1000D of this embodiment achieves efficiency and advantages similar to those of the light source module 1000C of the fourth embodiment, which will not be repeated hereinafter.

Sixth Embodiment

FIG. 6 is a schematic diagram of a light source module according to the sixth embodiment of the invention. A light source module 1000E of this embodiment is similar to the light source module 1000C of the fourth embodiment. Therefore, identical elements are denoted by the same reference numerals. A main difference between the two light source modules lies in that: a shape of an opening 6220 of this embodiment is different from the shape of the opening 4220 of the fourth embodiment. The following paragraphs further explain the difference, and the common parts of the two light source modules are omitted hereinafter.

In this embodiment, the opening 6220 of the light guide element 6200 further includes a tower-shaped top 6222 and a second side wall 6224 connecting the top surface 6204 and the first side wall 6226. The second side wall 6224 surrounds the optical axis Z and forms a tower shape that has a gradually increasing caliber. The tower-shaped top 6222 and the second side wall 6224 are circularly symmetrical relative to the optical axis Z, and the light emitting unit 1100 is disposed in the opening 6220. When the light beam L emitted from the light source 1120 is guided by the lens structure 1140 and transmitted to the tower-shaped top 6222, the light beam L transmitted to the tower-shaped top 6222 is refracted to the second side wall 6224. The second side wall 6224 then totally reflects a portion of the light beam L to the top surface 6204 of the light guide element 6200. Following that, the portion of the light beam L is totally reflected at the top surface 6204 of the light guide element 6200 to the first optical micro-structures 1240 on the bottom surface 6202. Because the light guide element 6200 of this embodiment has the tower-shaped top 6222 and the second side wall 6224, the portion of the light beam L that exits the lens structure 1140 and has a smaller included angle with the optical axis may enter the light guide element 6200 more easily to further improve the efficiency of light utilization of the light source module 1000E. The thickness of the light guide element 6200 may be made thinner to fabricate the light source module 1000E of this embodiment with thinner thickness. Moreover, the light source module 1000E of this embodiment achieves efficiency and advantages similar to those of the light source module 1000C of the fourth embodiment, which will not be repeated hereinafter.

Seventh Embodiment

FIG. 7 is a schematic diagram of a light source module according to the seventh embodiment of the invention. A light source module 1000F of this embodiment is similar to the light source module 1000C of the fourth embodiment. Therefore, identical elements are denoted by the same reference numerals. A main difference between the two light source modules lies in that: the first optical micro-structures 7240 of this embodiment are different from the first optical micro-structures 1240 of the fourth embodiment. The following paragraphs further explain the difference, and the common parts of the two light source modules are omitted hereinafter.

In more detail, in this embodiment, each of the first optical micro-structures 7240 includes a circular groove 7241, which has an inclined plane 7242 and a vertical plane 7243, wherein the inclined plane 7242 is configured at the periphery of the vertical plane 7243. In addition, the light source module 1000C of this embodiment further includes a reflective sheet 7300. The reflective sheet 7300 is configured on a side of the first optical micro-structures 7240 and adjacent to the inclined plane 7242 of the circular groove 7241. After the light beam L enters the light guide element 7200 from the lens structure 1140, the light beam L is refracted out of the light guide element 7200 by the vertical planes 7243 of the first optical micro-structures 7240. The light beam L refracted out of the light guide element 7200 is reflected to the inclined plane 7242 of the circular groove 7241 by the reflective sheet 7300. The light beam L transmitted to the inclined plane 7242 is refracted by the inclined plane 7242 of the circular groove 7241 and enters the light guide element 4200. Accordingly, the light beam that may exit the light guide element 7200 via the first optical micro-structures 7240 is reflected back to the light guide element 7200 by the reflective sheet 7300. Therefore, the light utilization efficiency of the light source module 1000F is improved. Moreover, the light source module 1000F of this embodiment achieves efficiency and advantages similar to those of the light source module 1000C of the fourth embodiment, which will not be repeated hereinafter.

Eighth Embodiment

Figure 8:
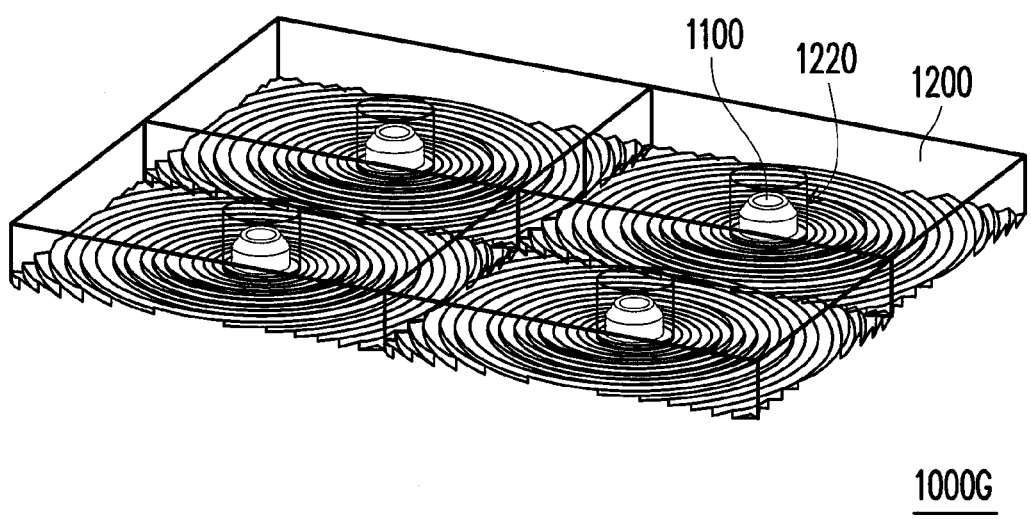
FIG. 8 is a schematic diagram of a light source module according to the eighth embodiment of the invention.

FIG. 8 is a schematic diagram of a light source module according to the eighth embodiment of the invention. A light source module 1000G of this embodiment is similar to the light source module 1000 of the first embodiment. Therefore, identical elements are denoted by the same reference numerals. A main difference between the two light source modules lies in that: the light source module 1000G of this embodiment includes a plurality of the light emitting units 1100 and a plurality of the light guide elements 1200.

Referring to FIG. 8, the light source module 1000G of this embodiment includes a plurality of the light guide elements 1200 that are arranged in array. The light guide elements 1200 respectively include a plurality of openings 1220. The light emitting units 1100 are respectively disposed in the openings 1220, and the light guide elements 1200 are configured adjacent to each other on the same plane. The light guide elements 1200 and the light emitting units 1100 may be combined to form a large-sized planar light source to be used for different purposes (e.g. used as a backlight source of a large-sized TV). The number of the light guide elements 1200 and the number of the light emitting units 1100 are adjustable according to the actual need. The number of the light guide elements 1200 and the number of the light emitting units 1100 are not limited to the example disclosed in FIG. 8.

Ninth Embodiment

Figure 9:
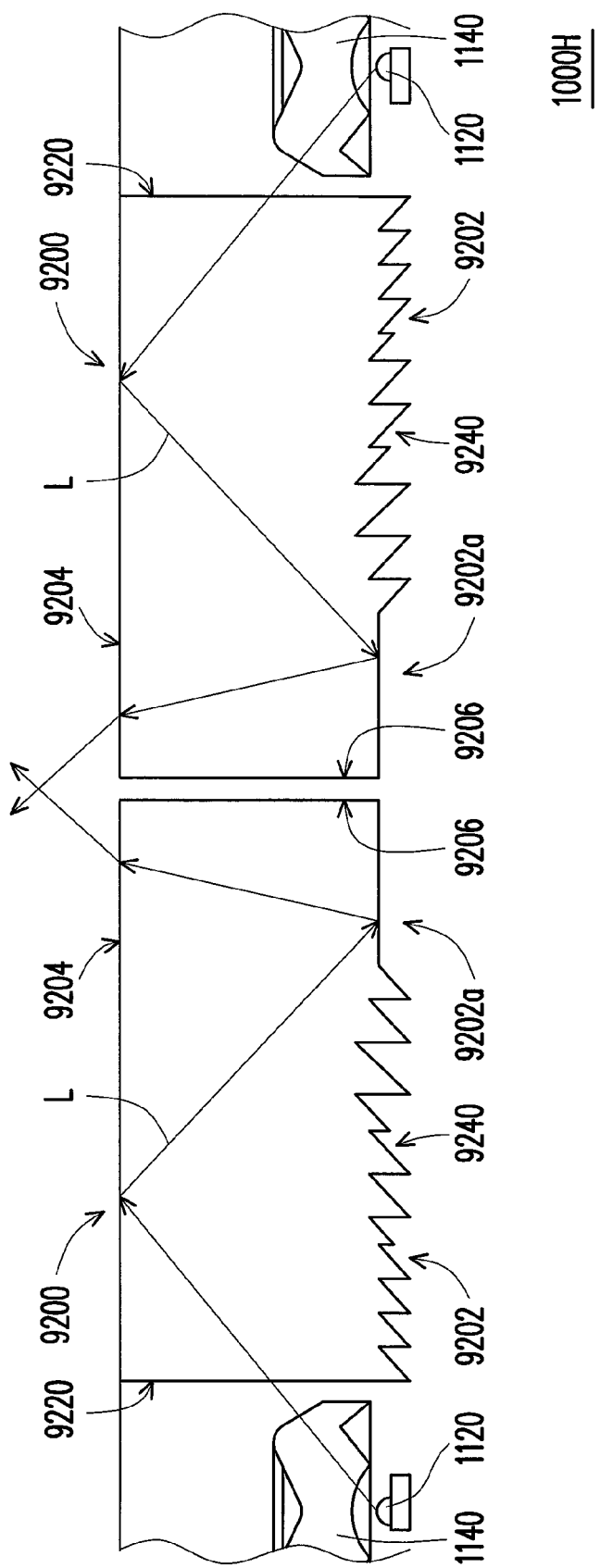
FIG. 9 is a schematic diagram of a light source module according to the ninth embodiment of the invention.

FIG. 9 is a schematic diagram of a light source module according to the ninth embodiment of the invention. A light source module 1000H of this embodiment is similar to the light source module 1000G of the eighth embodiment. Therefore, identical elements are denoted by the same reference numerals. A main difference between the two light source modules lies in that: a light guide element 9200 of this embodiment has a structure different from the structure of the light guide element 1200 of the eighth embodiment. The following paragraphs further explain the difference, and the common parts of the two light source modules are omitted hereinafter.

In this embodiment, the light guide element 9200 further includes a bottom surface 9202, a top surface 9204 opposite to the bottom surface 9202, and a lateral surface 9206 connecting the bottom surface 9202 and the top surface 9204. The first optical micro-structures 9240 and an opening 9220 of the light guide element 9200 are configured on the bottom surface 9202 of the light guide element 9200. The bottom surface 9202 has a recess platform 9202a. The recess platform 9202a connects the first optical micro-structures 9240 and the lateral surface 9206 of the light guide element 9200.

Figure 10:
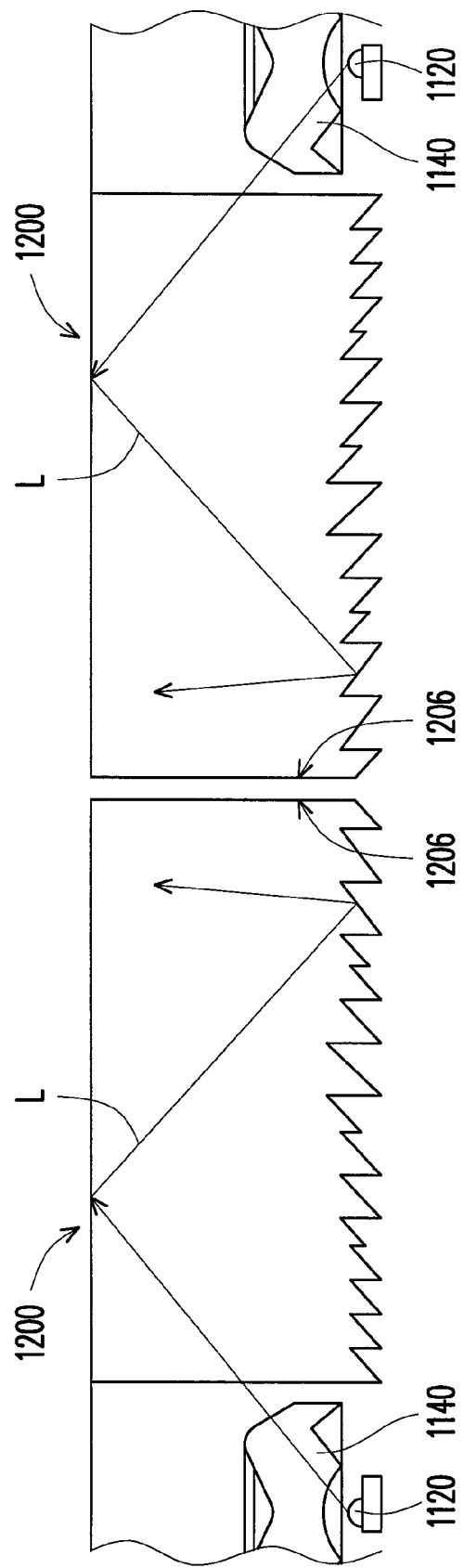
FIG. 10 is a schematic diagram of a light source module of a comparison example.

It is noted that the design of the recess platform 9202a is applicable to a light source module that includes a plurality of light guide elements and a plurality of light emitting units, so that the planar light source generated by the light source module has better uniformity. FIG. 10 is a schematic diagram of a light source module of a comparison example. The only difference between the light source module of FIG. 10 and the light source module of this embodiment is that: the light guide element 1200 of the comparison example does not have a recess platform. Referring to FIG. 10, after the light beam L emitted from the light source 1120 enters the light guide element 1200 via the lens structure 1140, a distribution of the light beam L near the lateral surface 1206 of the light guide element 1200 is sparser. In other words, when a plurality of the light guide elements 1200 are combined, the distribution of the light beam L becomes weaker at junctions of the light guide elements 1200, which affects the uniformity of the light source module. Referring to FIG. 9, in this embodiment, the bottom surface 9202 of the light guide element 9200 has the recess platform 9202a. The recess platform 9202a makes the light beam L near the lateral surface 9206 of each light guide element 9200 exit the light guide element 9200 via the top surface 9204 at a larger exit angle. Accordingly, the light beam L near the lateral surface 9206 of each light guide element 9200 intersects each other to improve the weaker distribution of the light beam L at the junctions of the light guide elements 9200.

Tenth Embodiment

Figure 11:
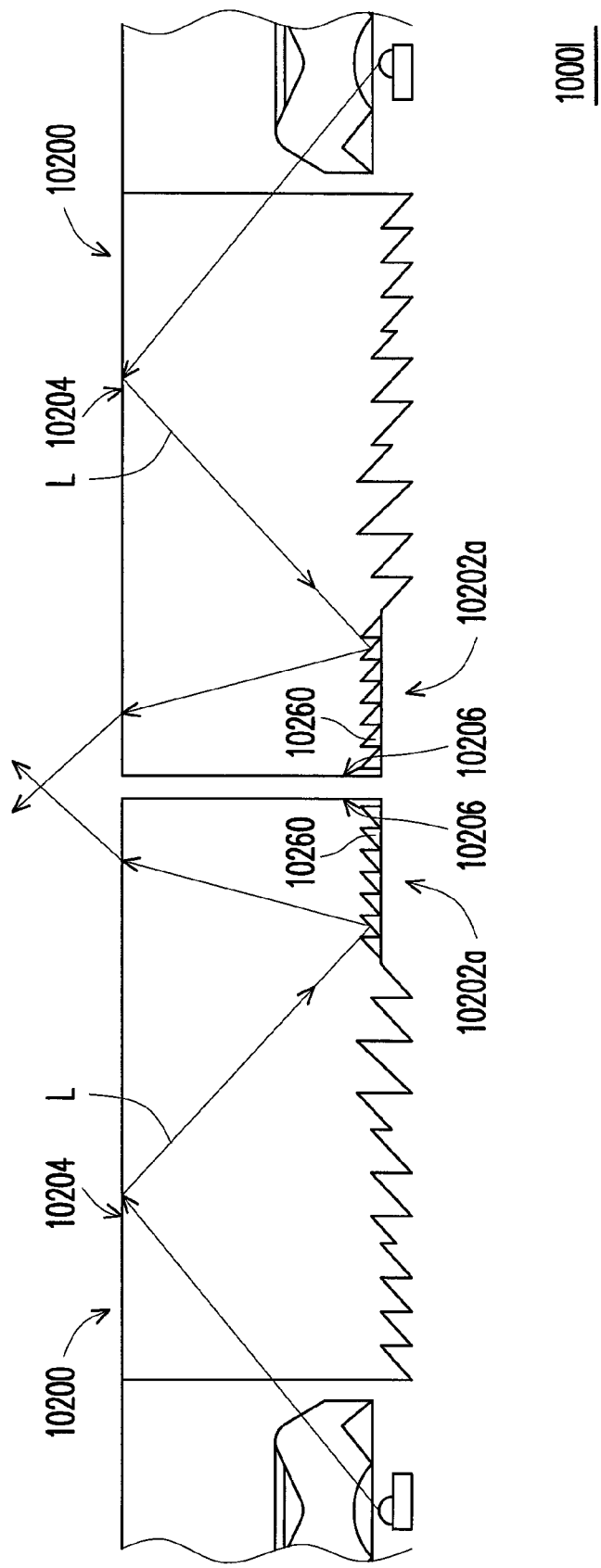
FIG. 11 is a schematic diagram of a light source module according to the tenth embodiment of the invention.

FIG. 11 is a schematic diagram of a light source module according to the tenth embodiment of the invention. A light source module 1000I of this embodiment is similar to the light source module 1000H of the ninth embodiment. Therefore, identical elements are denoted by the same reference numerals. A main difference between the two light source modules lies in that: a light guide element 10200 further includes a plurality of second optical micro-structures 10260. The following paragraphs further explain the difference, and the common parts of the two light source modules are omitted hereinafter.

The light guide element 10200 of this embodiment further includes a plurality of second optical micro-structures 10260. The second optical micro-structures 10260 are configured on a recess platform 10202a. It is worth mentioning that the design of configuring the second optical micro-structures 10260 on the recess platform 10202a further improves the weaker distribution of the light beam L at the junctions of the light guide elements 10200. In more detail, the second optical micro-structures 10260 on the recess platform 10202a of the light guide element 10200 make the light beam L near the lateral surface 10206 of each light guide element 10200 exit from the top surface 10204 at a larger exit angle. According to the above, the light beam L near the lateral surface 10206 forms a wider intersection area, so as to improve the weaker distribution of the light beam L at the junctions of the light guide elements 10200.

Eleventh Embodiment

Figure 12:
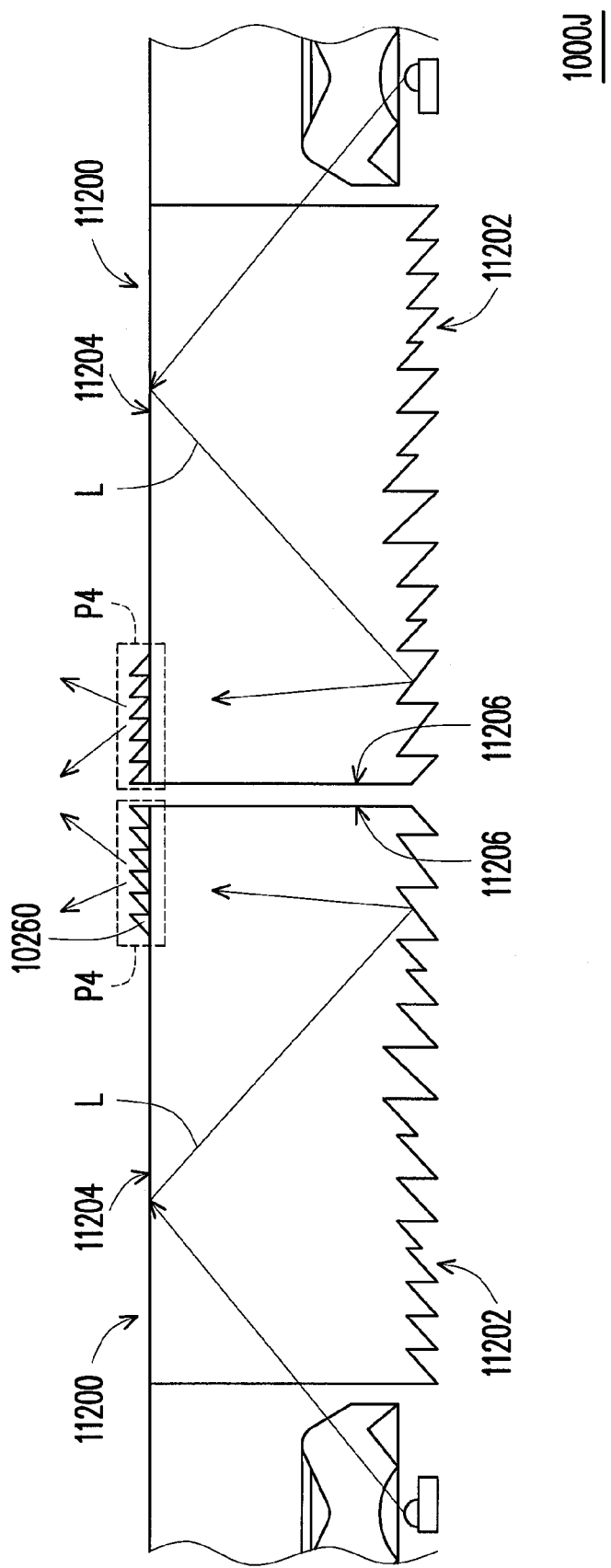
FIG. 12 is a schematic diagram of a light source module according to the eleventh embodiment of the invention.

FIG. 12 is a schematic diagram of a light source module according to the eleventh embodiment of the invention. A light source module 1000J of this embodiment is similar to the light source module 1000I of the tenth embodiment. Therefore, identical elements are denoted by the same reference numerals. The main differences between the two light source modules lie in that: a bottom surface 11202 of the light guide element 11200 of this embodiment does not have a recess platform thereon, and the second optical micro-structures 10260 are configured on positions different from those of the tenth embodiment. The following paragraphs further explain the difference, and the common parts of the two light source modules are omitted hereinafter.

In this embodiment, the light guide element 11200 further includes the bottom surface 11202, a top surface 11204 opposite to the bottom surface 11202, and a lateral surface 11206 connecting the bottom surface 11202 and the top surface 11204. The light guide element 11200 includes a plurality of second optical micro-structures 10260. The second optical micro-structures 10260 are configured on an edge area P4 of the top surface 11204 of the light guide element 11200. Similarly, the second optical micro-structures 10260 make the light beam L exit from the top surface 11204 at a larger exit angle. The configuration of the second optical micro-structures 10260 also helps improve the weaker distribution of the light beam L at the junctions of the light guide elements 11200.

In conclusion of the above, by coordinating the lens structure and the light guide element, the light beam from the light source of the light source module disclosed in the embodiments of the invention is uniformly emitted from the light emitting side of the light guide element and focused on the viewing direction (i.e. extension direction of the optical axis). Therefore, the light source modules of the embodiments of the invention may guide the light beam without overly using the conventional diffusion plate, and achieve high efficiency of light utilization and uniformity.

It is noted that the above disclosures are exemplary embodiments of the invention, and should not be construed as limitations to the scope of the invention. That is, the scope of the invention shall cover all equivalents, alterations, and modifications that may be made based on the content disclosed in the claims and specification of the invention. In addition, any of the embodiments or claims of the invention does not necessarily achieve all the purposes, advantages, or features disclosed above. The abstract and the title of the invention are provided to facilitate patent search, and should not be construed as limitations to the scope of the invention. Furthermore, terms, such as "first," "second," etc., mentioned in the specification or claims are simply for naming the elements or distinguishing different embodiments or scopes, and thus should not be construed as the upper or lower limit of the number of any element.

What is claimed is:

1. A light source module, comprising:
at least one light emitting unit, comprising:
a light source emitting a light beam and having an optical axis; and
a lens structure having a bottom surface, a top surface opposite to the bottom surface, and a first surface connecting the bottom surface and the top surface, wherein the bottom surface faces towards the light source and has a first recess and a second recess connecting the first recess and the first surface, the top surface has a third recess, the optical axis of the light source passes through the first recess and the third recess, and the first surface inclines relative to the optical axis; and
at least one light guide element comprising at least one opening and a plurality of first optical micro-structures surrounding the opening, wherein the light emitting unit is disposed in the opening, and the light beam passes through the lens structure and enters the light guide element via the opening.

2. The light source module according to claim 1, wherein the light beam enters the lens structure via the first recess.

3. The light source module according to claim 2, wherein a portion of the light beam is refracted to the third recess by the first recess, and the portion of the light beam transmitted to the third recess is reflected to the first surface by the third recess and exits the lens structure via the first surface.

4. The light source module according to claim 3, wherein the portion of the light beam forms a first angle with the optical axis before entering the lens structure, and the first angle is in a range of 0-25 degrees.

5. The light source module according to claim 2, wherein a portion of the light beam is refracted to the third recess by the first recess, the portion of the light beam transmitted to the third recess is reflected to the first surface by the third recess, the portion of the light beam transmitted to the first surface is reflected to the second recess by the first surface, and the portion of the light beam transmitted to the second recess is reflected by the second recess and exits the lens structure.

6. The light source module according to claim 5, wherein the lens structure further has: a second surface connecting the second recess of the bottom surface and the first surface, wherein the portion of the light beam is transmitted to the second surface after being reflected by the second recess and exits the lens structure via the second surface.

7. The light source module according to claim 6, wherein the optical axis is located on a reference plane, and sectional lines of the second surface on the reference plane comprise two line segments, which are substantially parallel to the optical axis.

8. The light source module according to claim 5, wherein the second recess has a side wall that inclines relative to the optical axis.

9. The light source module according to claim 8, wherein the portion of the light beam is refracted to the third recess by the first recess, the portion of the light beam transmitted to the third recess is reflected to the first surface by the third recess, the portion of the light beam transmitted to the first surface is reflected to the side wall of the second recess by the first surface, and the portion of the light beam transmitted to the side wall of the second recess is reflected by the side wall of the second recess and exits the lens structure.

10. The light source module according to claim 5, wherein the portion of the light beam forms a second angle with the optical axis before entering the lens structure, and the second angle is in a range of 25-40 degrees.

11. The light source module according to claim 2, wherein a portion of the light beam is refracted to the first surface by the first recess and directly exits the lens structure via the first surface.

12. The light source module according to claim 11, wherein the portion of the light beam forms a third angle with the optical axis before entering the lens structure, and the third angle is in a range of 40-60 degrees.

13. The light source module according to claim 1, wherein the lens structure further has a third surface connecting the third recess and the first surface, wherein the optical axis is located on a reference plane, a sectional line of the third recess on the reference plane comprises a first sectional line, a sectional line of the third surface on the reference plane comprises a second sectional line, and an included angle formed by the optical axis and a connection line between an intersection point of the first sectional line and the second sectional line and the light source is greater than 25 degrees.

14. The light source module according to claim 13, wherein the optical axis is located on a reference plane, a sectional line of the first surface on the reference plane comprises a third sectional line, and an included angle formed by the optical axis and a connection line between an intersection point of the second sectional line and the third sectional line and the light source is greater than 40 degrees.

15. The light source module according to claim 1, wherein the lens structure further has a second surface connecting the first surface and the second recess, wherein the optical axis is located on a reference plane, a sectional line of the first surface on the reference plane comprises a third sectional line, a sectional line of the second surface on the reference plane comprises a fourth sectional line, and an included angle formed by the optical axis and a connection line between an intersection point of the third sectional line and the fourth sectional line and the light source is greater than 60 degrees.

16. The light source module according to claim 1, wherein the optical axis passes through a center of the first recess and a center of the third recess.

17. The light source module according to claim 1, wherein the first recess, the second recess, the third recess or the first surface are circularly symmetrical to the optical axis.

18. The light source module according to claim 1, wherein the second recess surrounds the first recess.

19. The light source module according to claim 1, wherein the optical axis is located on a reference plane, and sectional lines of the third recess of the lens structure on the reference plane comprise two curved lines that intersect each other, and the curved lines protrude outward from the lens structure.

20. The light source module according to claim 1, wherein the third recess is a tapered recess.

21. The light source module according to claim 1, wherein the lens structure and the light guide element are integrally formed.

22. The light source module according to claim 1, wherein each of the first optical micro-structures comprises a circular groove, which has an inclined plane and a vertical plane, and the inclined plane of the circular groove is configured at a periphery of the vertical plane.

23. The light source module according to claim 1, wherein each of the first optical micro-structures comprises a circular groove, which comprises an inclined plane and a vertical plane, and the vertical plane of the circular groove is configured at a periphery of the inclined plane.

24. The light source module according to claim 23, wherein a depth of the circular groove of each of the first optical micro-structures gradually increases in a direction away from the optical axis and then gradually decreases.

25. The light source module according to claim 23, wherein a slope of the inclined plane of the circular groove of each of the first optical micro-structures gradually increases in the direction away from the optical axis and then gradually decreases.

26. The light source module according to claim 1, further comprising: a reflective sheet, wherein the light guide element comprises a bottom surface and a top surface opposite to the bottom surface, the first optical micro-structures and the opening are configured on the bottom surface of the light guide element, and the reflective sheet is disposed besides the bottom surface.

27. The light source module according to claim 1, wherein the light guide element comprises a bottom surface and a top surface opposite to the bottom surface, the first optical micro-structures and the opening are disposed on the bottom surface of the light guide element, the opening has a first side wall connecting the bottom surface and the top surface of the light guide element, and the first side wall of the opening surrounds the optical axis and has a tower-shaped top having a gradually decreasing caliber.

28. The light source module according to claim 27, wherein the opening further comprises a second side wall connecting the top surface of the light guide element and the first side wall of the opening, and the second side wall of the opening surrounds the optical axis and has a tower shape with a gradually increasing caliber.

29. The light source module according to claim 1, wherein a plurality of the light guide elements are configured adjacent to each other on the same plane.

30. The light source module according to claim 29, wherein each of the light guide elements comprises a bottom surface, a top surface opposite to the bottom surface, and a lateral surface connecting the bottom surface and the top surface, wherein the first optical micro-structures and the opening of each of the light guide elements are configured on the bottom surface of the light guide element, and the bottom surface comprises a recess platform connecting the first optical micro-structures and the lateral surface of the light guide element.

31. The light source module according to claim 30, wherein each of the light guide elements further comprises a plurality of second optical micro-structures configured on the recess platform.

32. The light source module according to claim 29, wherein each of the light guide elements comprises a bottom surface, a top surface opposite to the bottom surface, and a lateral surface connecting the bottom surface and the top surface, wherein each of the light guide elements comprises a plurality of third optical micro-structures configured on an edge area of the top surface.

* * * * *